United States Patent
Tseng et al.

(10) Patent No.: US 12,376,417 B2
(45) Date of Patent: Jul. 29, 2025

(54) SEMICONDUCTOR DEVICE WITH NANOSTRUCTURES

(71) Applicant: TAIWAN SEMICONDUCTOR MANUFACTURING CO., LTD., Hsinchu (TW)

(72) Inventors: Hsin-Hsiang Tseng, Changhua County (TW); Chih-Fei Lee, Tainan (TW); Chia-Pin Cheng, Kaohsiung (TW); Fu-Cheng Chang, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 13 days.

(21) Appl. No.: 18/359,658

(22) Filed: Jul. 26, 2023

(65) Prior Publication Data

US 2023/0369517 A1 Nov. 16, 2023

Related U.S. Application Data

(60) Continuation of application No. 18/070,311, filed on Nov. 28, 2022, now Pat. No. 11,777,040, which is a continuation of application No. 17/067,548, filed on Oct. 9, 2020, now Pat. No. 11,515,435, which is a continuation of application No. 16/390,080, filed on Apr. 22, 2019, now Pat. No. 10,804,414, which is a division of application No. 15/469,646, filed on Mar. 27, 2017, now Pat. No. 10,269,990.

(60) Provisional application No. 62/433,307, filed on Dec. 13, 2016.

(51) Int. Cl.
*H10F 77/30* (2025.01)
*H10F 30/28* (2025.01)
*H10F 39/00* (2025.01)
*H10F 39/18* (2025.01)
*H10F 77/40* (2025.01)

(52) U.S. Cl.
CPC ....... *H10F 77/331* (2025.01); *H10F 30/2857* (2025.01); *H10F 39/011* (2025.01); *H10F 39/18* (2025.01); *H10F 77/40* (2025.01); *Y02E 10/50* (2013.01); *Y02P 70/50* (2015.11)

(58) Field of Classification Search
CPC ......... H01L 31/02162–02165; H01L 31/0232; H01L 31/02366; H01L 31/18; H01L 31/1812; H01L 31/204
See application file for complete search history.

(56) References Cited

U.S. PATENT DOCUMENTS

| | | |
|---|---|---|
| 2010/0117108 A1 | 5/2010 | Gaebler et al. |
| 2011/0115041 A1 | 5/2011 | Dan et al. |
| 2011/0133061 A1 | 6/2011 | Yu et al. |
| 2012/0153124 A1 | 6/2012 | Yu et al. |
| 2015/0214261 A1 | 7/2015 | Park et al. |
| 2016/0240580 A1 * | 8/2016 | Xianyu ............ H01L 27/14647 |
| 2017/0012078 A1 | 1/2017 | Han et al. |

* cited by examiner

*Primary Examiner* — Tucker J Wright
(74) *Attorney, Agent, or Firm* — Maschoff Brennan (57) ABSTRACT

An image sensor device includes nanostructures for improving light absorption efficiency. The image sensor device includes a substrate, a light absorption region, and a nanostructure array. The light absorption region is over the substrate. The nanostructure array us over the light absorption region. The nanostructure array includes a plurality of nanostructures repeatedly arranged from a top view.

20 Claims, 10 Drawing Sheets

SEMICONDUCTOR DEVICE WITH NANOSTRUCTURES

RELATED APPLICATIONS

The present application is a continuation application of U.S. application Ser. No. 18/070,311, filed Nov. 28, 2022, which is a continuation application of U.S. application Ser. No. 17/067,548, filed Oct. 9, 2020, now U.S. Pat. No. 11,515,435, issued Nov. 29, 2022, which is a continuation application of U.S. application Ser. No. 16/390,080, filed Apr. 22, 2019, now U.S. Pat. No. 10,804,414, issued Oct. 13, 2020, which is a divisional application of U.S. application Ser. No. 15/469,646, filed Mar. 27, 2017, now U.S. Pat. No. 10,269,990, issued Apr. 23, 2019, which claims priority of U.S. Provisional Application Ser. No. 62/433,307, filed Dec. 13, 2016, all of which are herein incorporated by reference in their entireties.

BACKGROUND

With exponential growths of semiconductor technologies, manufacture of small size, low power consumption and high throughput semiconductor devices has been realized with a high yield rate. Among the typical semiconductor devices, image sensor devices, such as complementary metal oxide semiconductor (CMOS) image sensor devices, are widely used in various imaging applications and products, such as smart phones, digital cameras, scanners, etc. In order to meet high pixel resolution requirements, more sensing pixels are desired to be arranged in an image sensor device with a limited size, which results in decreasing of the light absorption capability and increasing of the crosstalk of the sensing pixels.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

Further, spatially relative terms, such as "upper," "on," "above" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "and/or" includes any and all combinations of one or more of the associated listed items. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are directed to a semiconductor device with nanostructures and methods of forming the same for improving light absorption efficiency. In particular, the semiconductor device is configured for receiving incident light including a visible light wavelength band, an infrared light wavelength band and/or an ultraviolet light wavelength band, and the circle equivalent diameters of the projected portions of the nanostructures on the upper surface of the substrate are in a predetermined range of the visible light wavelength band, an infrared light wavelength band and/or an ultraviolet light wavelength band, in order to enhance visible light, infrared light and/or ultraviolet light absorption. With the nanostructures of the present disclosure, at least the dynamic range, the light absorption capability and the noise reduction of the semiconductor device can be improved.

Figure 1:
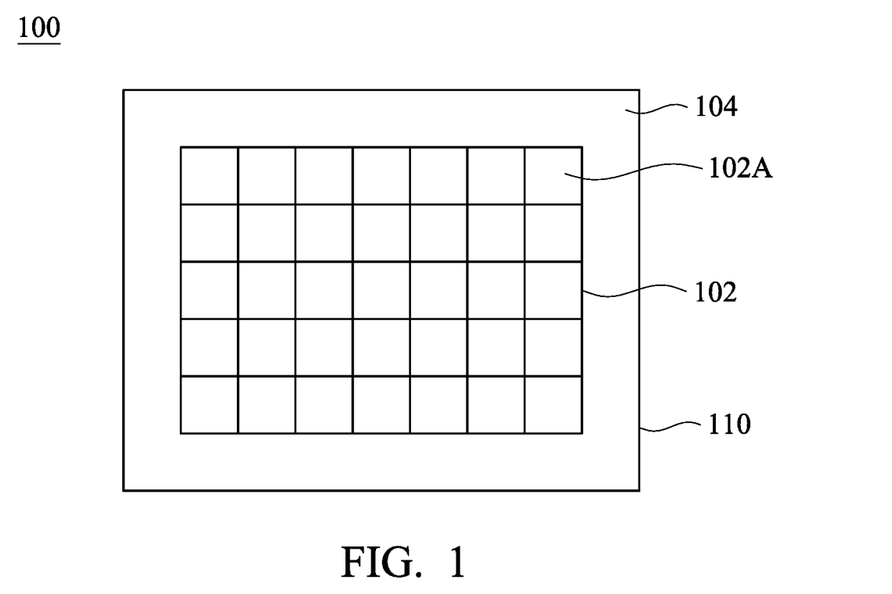
FIG. 1 is a schematic diagram of a semiconductor in accordance with some embodiments of the present disclosure.

FIG. 1 is a schematic diagram of a semiconductor device 100 in accordance with some embodiments of the present disclosure. The semiconductor device 100 may be an image sensor device, such as a back-side illuminated (BSI) CMOS image sensor device and a front-side illuminated (FSI) CMOS image sensor device, or another similar device. The semiconductor device 100 includes a substrate 110 and circuits (not shown) formed on the substrate 110. The substrate 110 has a sensing pixel area 102 and a logic area 104 surrounding the sensing pixel area 102. The sensing pixel area 102 includes sensing pixels 102A for generating electric charges responsive to light incident thereon. Some circuits (not shown) are located in the sensing pixel area 102 for transferring electric charges generated from the sensing pixels 102A to the logic area 104. Other circuits (not shown) are located in the logic area 104 for processing output signals from the sensing pixel area 102.

Figure 2A:
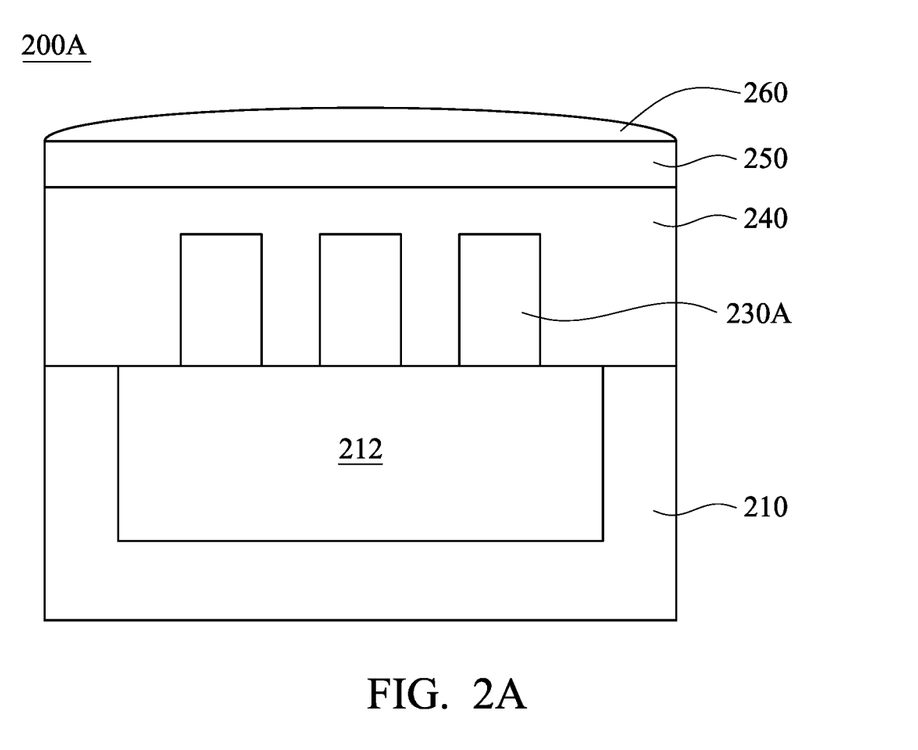
FIG. 2A is a schematic cross-sectional view of a semiconductor device in accordance with some embodiments of the present disclosure.

FIG. 2A is a schematic cross-sectional view of a semiconductor device 200A in accordance with some embodiments of the present disclosure. The semiconductor device 200A may be a portion of one or more of the sensing pixels 102A of the semiconductor device 100, a portion of any suitable type of image sensor device (e.g. a BSI or FSI CMOS image sensor device), or a portion of another suitable semiconductor device.

As shown in FIG. 2A, the semiconductor device 200A includes a substrate 210, protrusion nanostructures 230A, a dielectric layer 240, a light filter layer 250 and a microlens layer 260. The substrate 210 includes, but is not limited to, a semiconductor wafer, a silicon-on-insulator (SOI) substrate or an epitaxial substrate. In some embodiments, the substrate 210 includes an elementary semiconductor such as silicon, germanium or diamond. In various embodiments, the substrate 210 includes a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide or gallium indium phosphide.

The substrate 210 includes a photo sensing region 212 which is configured for absorbing incident light. In some embodiments, the substrate 210 is a p-type doped substrate, and the photo sensing region 212 is a doped region with n-type dopants. In certain embodiments, the substrate 210 is an n-type doped substrate, and the photo sensing region 212 is a doped region with p-type dopants.

The protrusion nanostructures 230A are directly on the photo sensing region 212. The protrusion nanostructures 230A may include, for example, silicon oxide, hafnium oxide, silicon, silicon germanium, combinations thereof, or the like. In particular, the protrusion nanostructures 230A respectively have projected portions on the upper surface of the substrate 210, and the circle equivalent diameter of each of the projected portions is between 100 nm and 1900 nm. The circle equivalent diameter $D_e$ is defined by equation: $D_e = (4A/\pi)^{1/2}$, where A is the area of the projected portion of the protrusion nanostructure. If the semiconductor device 200A is configured for sensing visible light, the circle equivalent diameter may be between 400 nm and 700 nm. If the semiconductor device 200A is configured for sensing infrared light, the circle equivalent diameter may be between 700 nm and 1900 nm. If the semiconductor device 200A is configured for sensing ultraviolet light, the circle equivalent diameter may be between 100 nm and 400 nm. In addition, the protrusion nanostructures 230A may have the same or different circle equivalent diameters and/or heights.

The dielectric layer 240 is disposed on the substrate 210 and covers the protrusion nanostructures 230A. The dielectric layer 240 may include undoped silica glass (USG), hafnium oxide, silicon, silicon germanium, combinations thereof, or the like. In some embodiments, the dielectric layer 240 may include multiple layers.

The light filter layer 250 is disposed on the dielectric layer 240. The light filter layer 250 is used to allow light components in a particular wavelength band to penetrate therethrough and block unwanted light components. The passing wavelength band of the light filter layer 250 may be a red light wavelength band, a green light wavelength band, a blue light wavelength band, an infrared light wavelength band, an ultraviolet light wavelength band, or combinations thereof, but is not limited thereto. The light filter layer 250 may include, such as pigment-based polymer, dye-based polymer, resin and another suitable material.

The microlens layer 260 is disposed on the light filter layer 250, and has a convex shape at its light receiving side for improving light receiving efficiency. The microlens layer 260 may include glass, acrylic polymer or another suitable material with high transmittance.

Figure 2B:
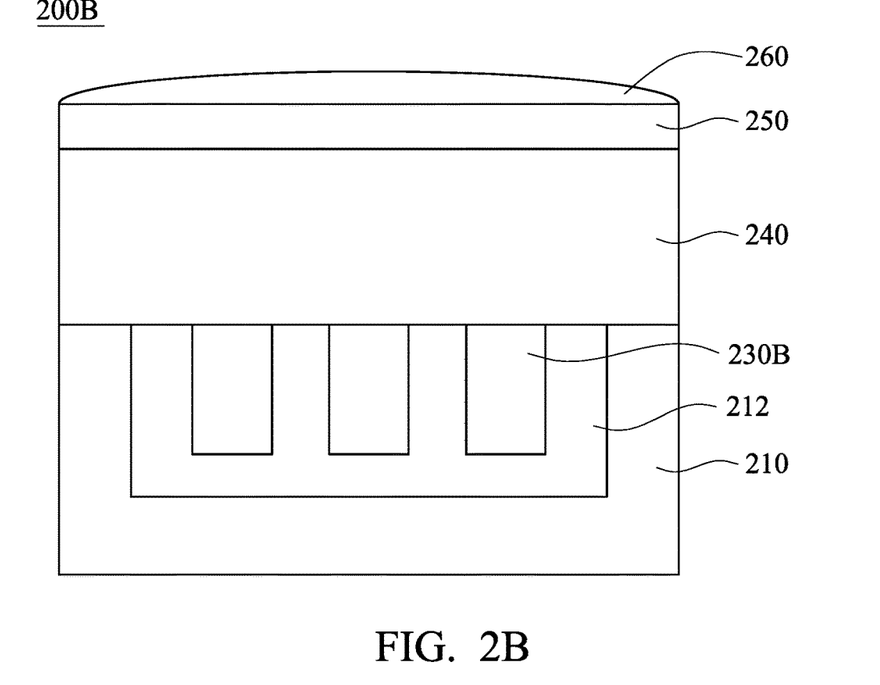
FIG. 2B is a schematic cross-sectional view of a semiconductor device in accordance with certain embodiments of the present disclosure.

FIG. 2B is a schematic cross-sectional view of a semiconductor device 200B in accordance with certain embodiments of the present disclosure. The semiconductor device 200B may be a portion of one or more of the sensing pixels 102A of the semiconductor device 100, a portion of any suitable type of image sensor device (e.g. BSI or FSI CMOS image sensor device), or a portion of another suitable semiconductor device. The difference between the semiconductor devices 200A and 200B is that the semiconductor device 200A includes embedded nanostructures 230B in the photo sensing region 212 rather than the protrusion nanostructures 230A. The embedded nanostructures 230B may include, for example, silicon oxide, hafnium oxide, silicon, silicon germanium, combinations thereof, or the like. In particular, the protrusion nanostructures 230B respectively have projected portions on the upper surface of the substrate 210, and the circle equivalent diameter of each of the projected portions is between 100 nm and 1900 nm. The circle equivalent diameter $D_e$ is defined by equation: $D_e = (4A/\pi)^{1/2}$, where A is the area of the projected portion of the protrusion nanostructure. If the semiconductor device 200B is configured for sensing visible light, the circle equivalent diameter may be between 400 nm and 700 nm. If the semiconductor device 200B is configured for sensing infrared light, the circle equivalent diameter may be between 700 nm and 1900 nm. If the semiconductor device 200B is configured for sensing ultraviolet light, the circle equivalent diameter may be between 100 nm and 400 nm. In addition, the protrusion nanostructures 230B may have the same or different circle equivalent diameters and/or heights. Detailed descriptions of the other elements the semiconductor devices 200B (i.e. the substrate 210, the dielectric layer 240, the light filter layer 250 and the microlens layer 260) are as illustrated above for FIG. 2A, and are not repeated herein.

Figure 2C:
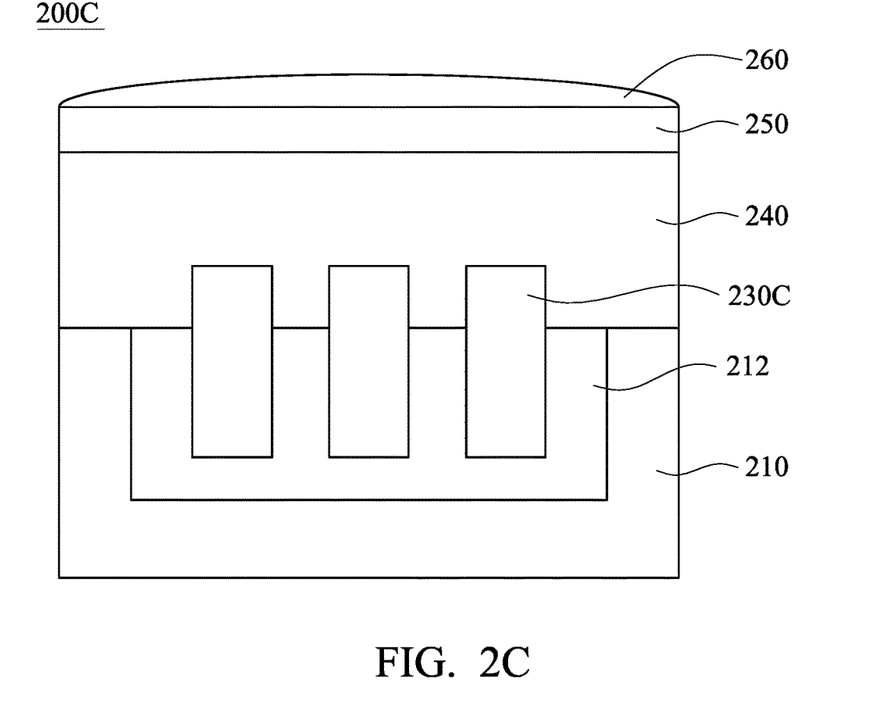
FIG. 2C is a schematic cross-sectional view of a semiconductor device in accordance with some embodiments of the present disclosure.

FIG. 2C is a schematic cross-sectional view of a semiconductor device 200C in accordance with some embodiments of the present disclosure. The semiconductor device 200C may be a portion of one or more of the sensing pixels 102A of the semiconductor device 100, a portion of any suitable type of image sensor device (e.g. BSI or FSI CMOS image sensor device), or a portion of another suitable semiconductor device. The difference between the semiconductor devices 200A and 200C is that the semiconductor device 200C includes embedded nanostructures 230C partially in the photo sensing region 212 and partially above the upper surface of the substrate 210 rather than the protrusion nanostructures 230A. The protrusion nanostructures 230C may include, for example, silicon oxide, hafnium oxide, silicon, silicon germanium, combinations thereof, or the like. In particular, the protrusion nanostructures 230C respectively have projected portions on the upper surface of the substrate 210, and the circle equivalent diameter of each of the projected portions is between 100 nm and 1900 nm. The circle equivalent diameter $D_e$ is defined by equation: $D_e=(4A/\pi)^{1/2}$, where A is the area of the projected portion of the protrusion nanostructure. If the semiconductor device 200C is configured for sensing visible light, the circle equivalent diameter may be between 400 nm and 700 nm. If the semiconductor device 200C is configured for sensing infrared light, the circle equivalent diameter may be between 700 nm and 1900 nm. If the semiconductor device 200C is configured for sensing ultraviolet light, the circle equivalent diameter may be between 100 nm and 400 nm. In addition, the protrusion nanostructures 230C may have the same or different circle equivalent diameters, heights of the portions partially in the photo sensing region 212 and/or height of the portions partially above the upper surface of the substrate 210. Detailed descriptions of the other elements the semiconductor devices 200C (i.e. the substrate 210, the dielectric layer 240, the light filter layer 250 and the microlens layer 260) are as illustrated above for FIG. 2A, and are not repeated herein.

As exemplarily illustrated in FIG. 2A through FIG. 2C, the protrusion nanostructures 230A and the embedded nanostructures 230B and 230C are pillar-shaped. In some other embodiments, some of the protrusion nanostructures 230A, the embedded nanostructures 230B and/or the embedded nanostructures 230C are pillar-shaped, and the others of the protrusion nanostructures 230A, the embedded nanostructures 230B and/or the embedded nanostructures 230C are cone-shaped. In certain other embodiments, the protrusion nanostructures 230A, the embedded nanostructures 230B and/or the embedded nanostructures 230C are cone-shaped.

Figure 3A:
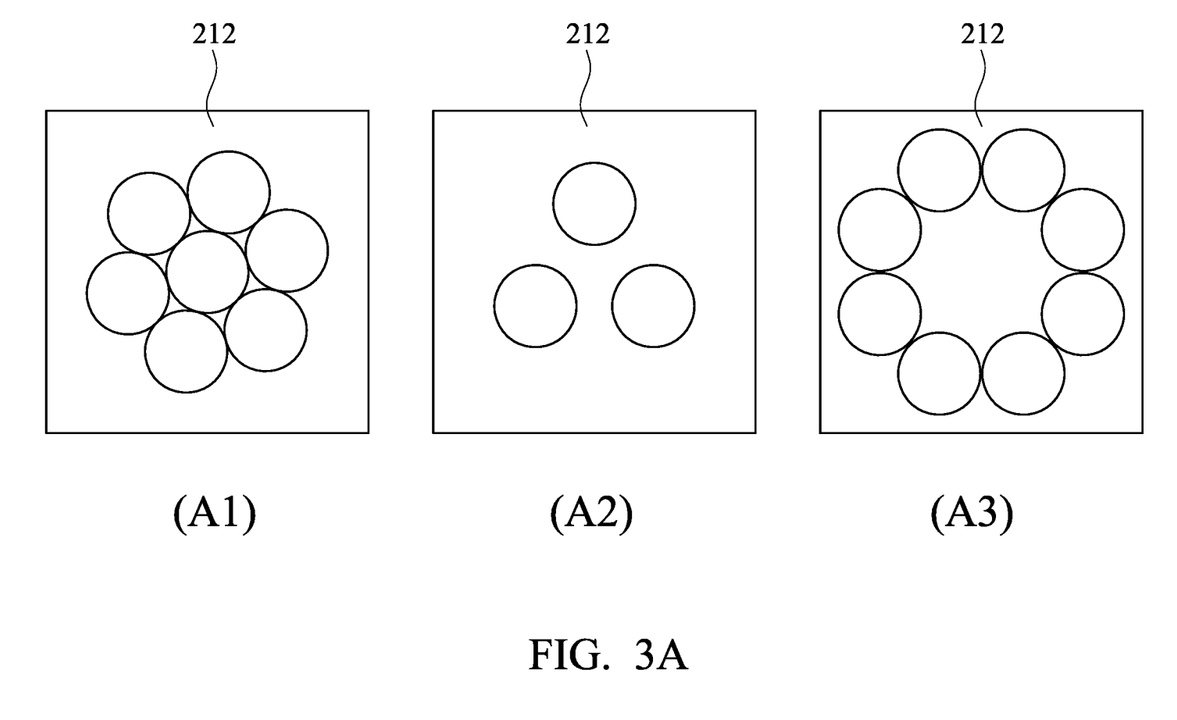
FIG. 3A exemplarily illustrates various arrangements of nanostructures in accordance with some embodiments of the present disclosure.

FIG. 3A exemplarily illustrates various arrangements of the protrusion nanostructures 230A or the embedded nanostructures 230B or 230C on the photo sensing region 212 in accordance with some embodiments of the present disclosure. As shown in FIG. 3A, the arrangement of the protrusion nanostructures 230A or the embedded nanostructures 230B or 230C may be a hexagonal close packing arrangement (A1), an octagonal arrangement (A2) or a triangular arrangement (A3). The protrusion nanostructures 230A or the embedded nanostructures 230B or 230C may have one or more side views of a hexagonal close packing arrangement, an octagonal arrangement, a triangular arrangement, combinations thereof, or another suitable arrangement.

Figure 3B:
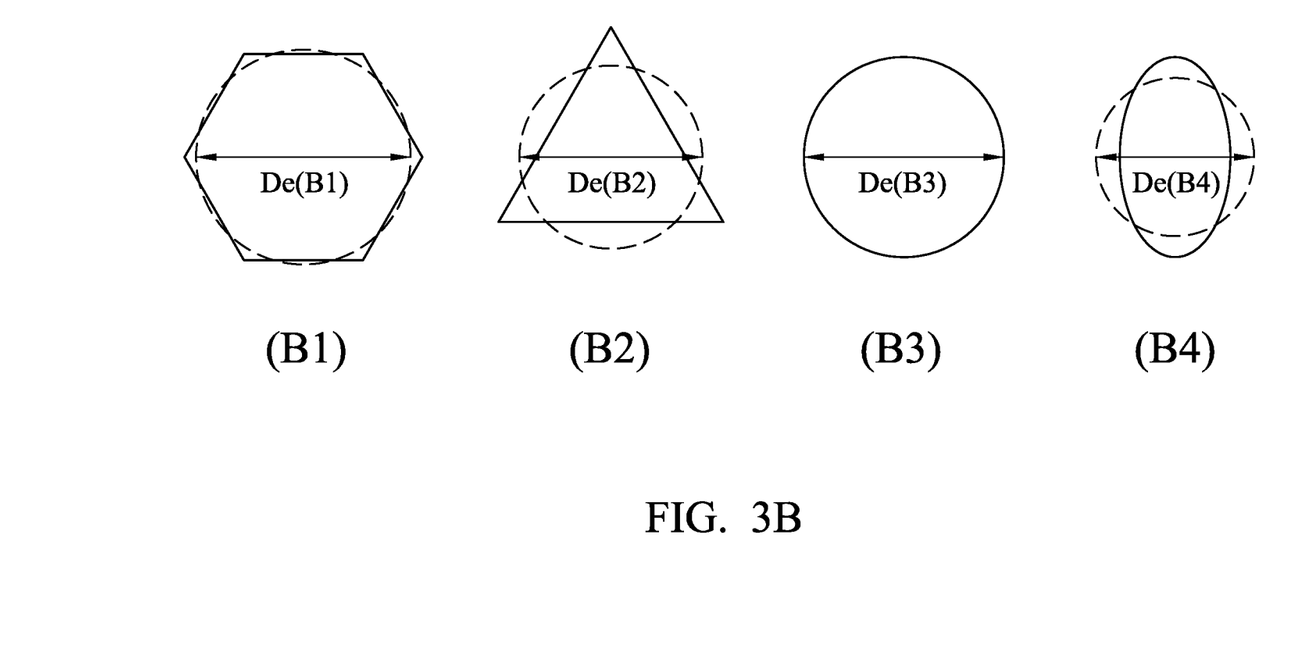
FIG. 3B exemplarily illustrates various top-view shapes of nanostructures in accordance with some embodiments of the present disclosure.

FIG. 3B exemplarily illustrates various top-view shapes of the protrusion nanostructures 230A or the embedded nanostructures 230B or 230C in accordance with some embodiments of the present disclosure. As shown in FIG. 3B, the top-view shape of each of the protrusion nanostructures 230A or the embedded nanostructures 230B or 230C may be a hexagonal shape (B1), a triangular shape (B2), a circular shape (B3) or an elliptical shape (B4). The hexagonal shape (B1), the triangular shape (B2), the circular shape (B3) or the elliptical shape (B4) respective have circle equivalent diameters De(B1), De(B2), De(B3) and De(B4). The top-view shapes of the protrusion nanostructures 230A or the embedded nanostructures 230B or 230C may be the same or different. In other words, the protrusion nanostructures 230A or the embedded nanostructures 230B or 230C may have one or more top-view shapes of a hexagonal shape, a triangular shape, a circular shape, an elliptical shape, combinations thereof, or another suitable shape.

Figure 3C:
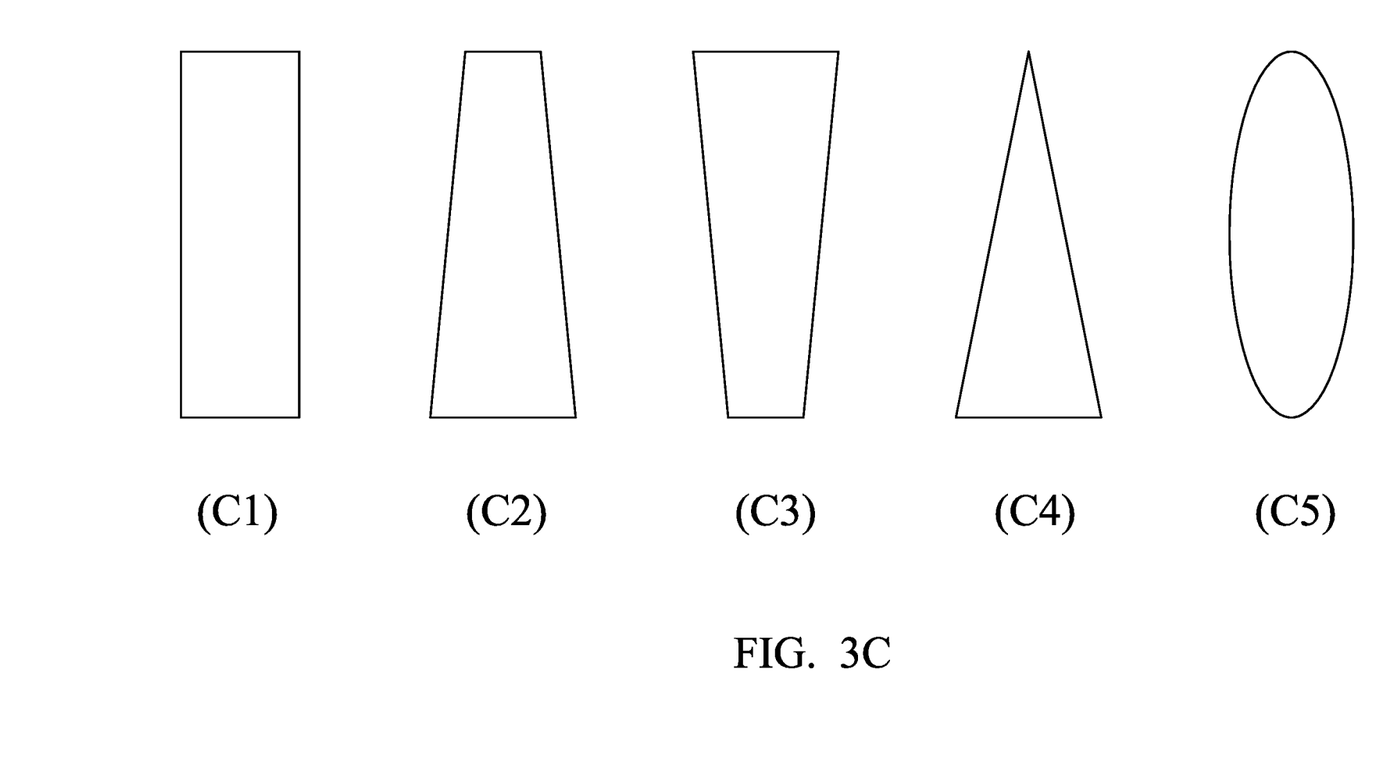
FIG. 3C exemplarily illustrates various side-view shapes of nanostructures in accordance with some embodiments of the present disclosure.

FIG. 3C exemplarily illustrates various side-view shapes of the protrusion nanostructures 230A or the embedded nanostructures 230B or 230C in accordance with some embodiments of the present disclosure. As shown in FIG. 3C, the side-view shape of each of the protrusion nanostructures 230A or the embedded nanostructures 230B or 230C may be a rectangular shape (C1), a trapezoid shape (C2), a reverse trapezoid shape (C3), a triangular shape (C4) or an elliptical shape (C5). The side-view shapes of the protrusion nanostructures 230A or the embedded nanostructures 230B or 230C may be the same or different. In other words, the protrusion nanostructures 230A or the embedded nanostructures 230B or 230C may have one or more side-view shapes of a rectangular shape, a trapezoid shape, a reverse trapezoid shape, a triangular shape, an elliptical shape, or combinations thereof.

Note that the arrangement, the top-view shapes and/or the side-view shapes of the protrusion nanostructures 230A or the embedded nanostructures 230B or 230C may be adjusted or modified based on particular design requirements other than those illustrated in FIG. 3A to FIG. 3C. In addition, the protrusion nanostructures 230A or the embedded nanostructures 230B or 230C may have two or more different arrangements. For example, the protrusion nanostructures 230A or the embedded nanostructures 230B or 230C may include a triangular arrangement and a hexagonal arrangement. Furthermore, for an image sensor device adopting the semiconductor device 200A, 200B and/or 200C for its sensing pixels, the arrangements, the top-view shapes and/or the side-view shapes of the protrusion nanostructures 230A or the embedded nanostructures 230B or 230C of the sensing pixels may be the same or different.

Figure 4A:
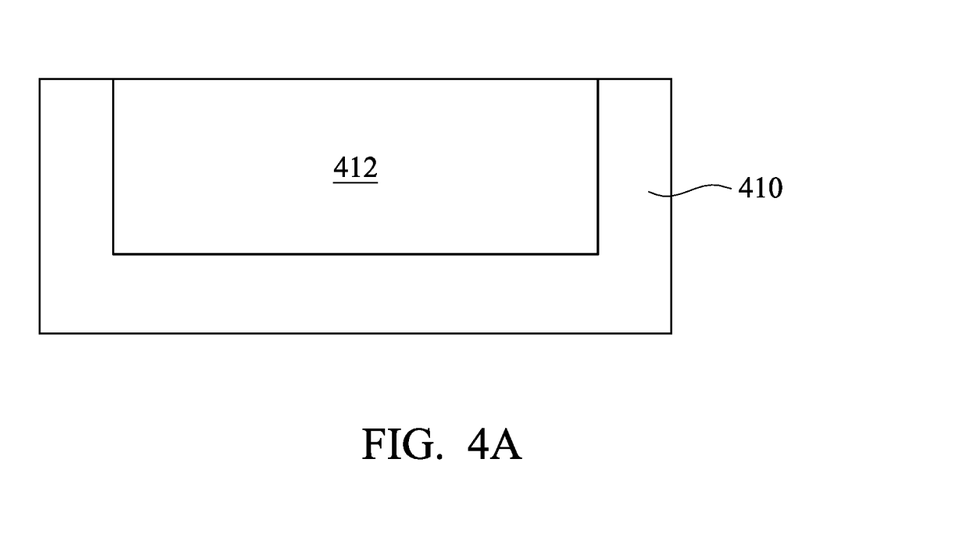
FIG. 4A to FIG. 4F are schematic cross-sectional views of intermediate stages in the formation of a semiconductor device in accordance with some embodiments of the present disclosure.

FIG. 4A to FIG. 4F are schematic cross-sectional views of intermediate stages in the formation of a semiconductor device in accordance with some embodiments of the present disclosure. In FIG. 4A, a substrate 410 is provided, which includes a photo sensing region 412. The substrate 410 may be, for example, an SOI substrate or an epitaxial substrate. In some embodiments, the substrate 410 is formed further including an elementary semiconductor such as silicon, germanium and diamond. In various embodiments, the substrate 410 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide and gallium indium phosphide.

The photo sensing region 412 is formed for absorbing incident light. In some embodiments, the substrate 410 is a p-type doped substrate, and the photo sensing region 412 is a doped region with n-type dopants. In certain embodiments, the substrate 410 is an n-type doped substrate, and the photo sensing region 412 is a doped region with p-type dopants. The photo sensing region 412 may be formed by an ion implantation process, a diffusion process, or another suitable process.

Figure 4B:
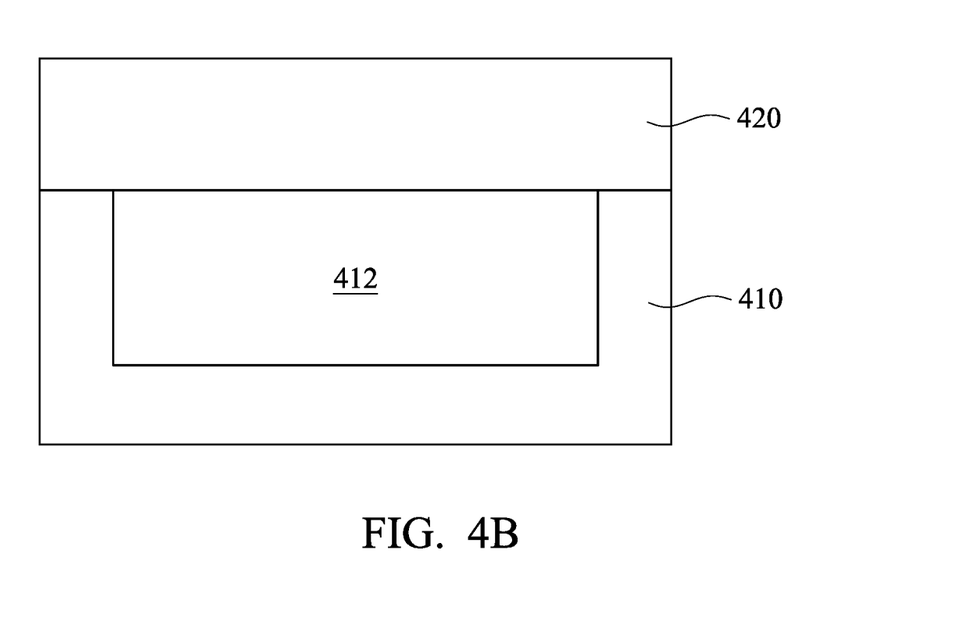

In FIG. 4B, a nanostructure layer 420 is formed on the substrate 410. The nanostructure layer 420 may be formed from, for example, silicon oxide, hafnium oxide, silicon, silicon germanium, combinations thereof, or the like. The nanostructure layer 420 may be formed by a deposition process such as a physical vapor deposition (PVD) process, a chemical vapor deposition (CVD) process, a low pressure CVD (LPCVD) process, a plasma enhanced CVD (PECVD) process, a high density plasma CVD (HDPCVD) process, an atomic layer deposition (ALD) process, a spin-on coating process, a sputtering process, and/or another suitable process.

Figure 4C:
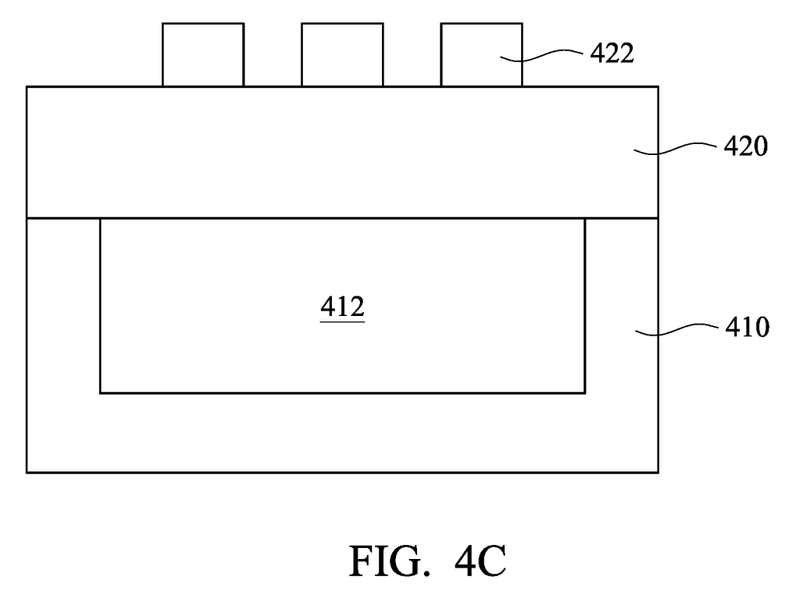

In FIG. 4C, a patterned photoresist layer 422 is formed on the nanostructure layer 420 and above the photo sensing region 412 of the substrate 410 to define etching portions of the nanostructure layer 420. Projected portions of the patterned photoresist layers 422 on the substrate 410 are within the upper surface of the photo sensing region 412.

Figure 4D:
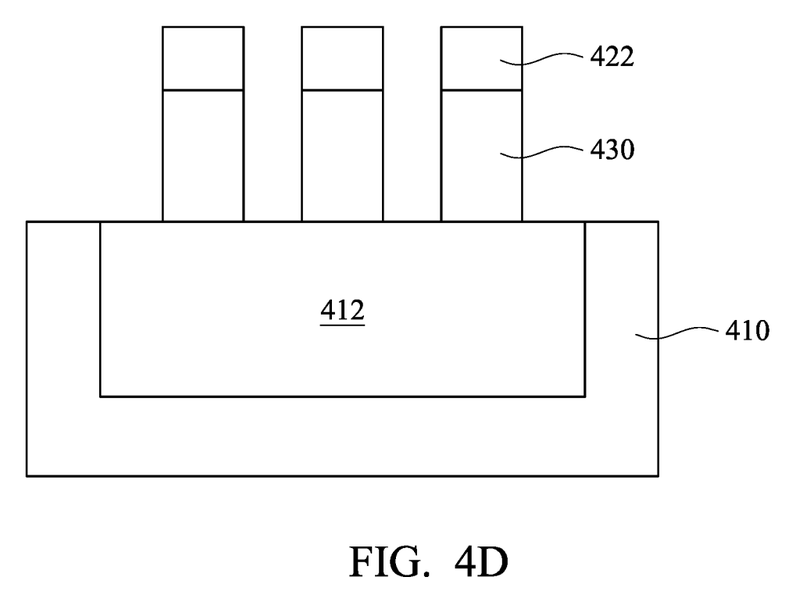

In FIG. 4D, some portions of the nanostructure layer 420 uncovered by the patterned photoresist layers 422 is removed, so as to form protrusion nanostructures 430. The etching process may be an isotropic etching process or an anisotropic etching process with low selectivity with respect to the substrate 410 and the photo sensing region 412, such as a reactive ion etching process, a plasma etching process, a dry etching process, and wet etching process, but is not limited thereto. In some embodiments, the protrusion nanostructures 430 are formed without exposing the substrate 410 and the photo sensing region 412.

In particular, each of the protrusion nanostructures 430 is formed having a projected portion on the upper surface of the substrate 410. A circle equivalent diameter of the projected portion is between 100 nm and 1900 nm. The circle equivalent diameter of the projected portion may be between 400 nm and 700 nm for enhancing visible light absorption, or may be between 700 nm and 1900 nm for enhancing infrared light absorption, or may be between 100 nm and 400 nm for enhancing ultraviolet light absorption. In addition, the protrusion nanostructures 430 may be formed having the same or different circle equivalent diameters and/or heights.

Moreover, the protrusion nanostructures 430 may be formed having one or more of the arrangements, the top-view shapes and the side-view shapes respectively illustrated in FIG. 3A to FIG. 3C, or other arrangement(s), top-view shape(s) and/or side-view shape(s).

Figure 4E:
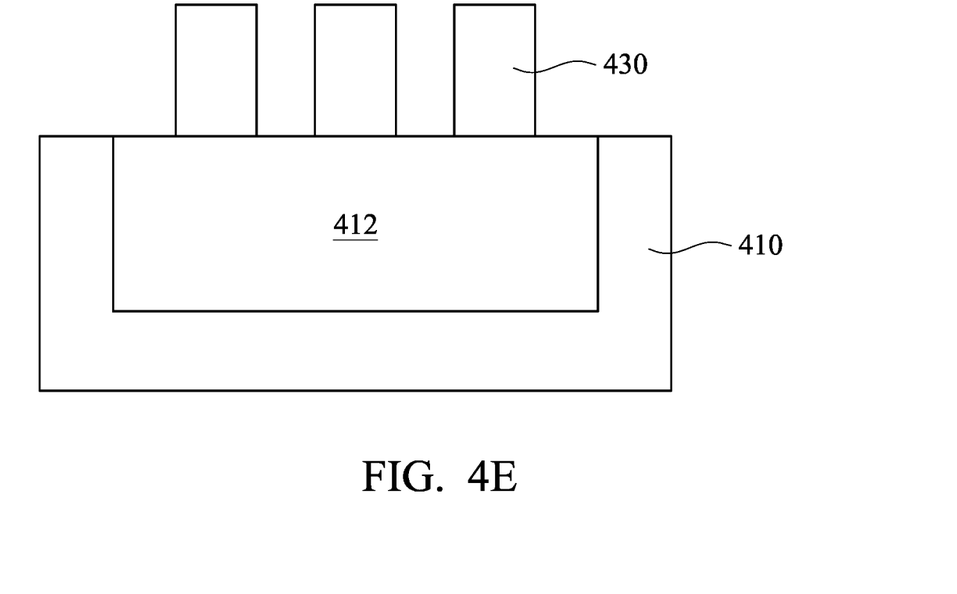

In FIG. 4E, after the etching process on the nanostructure layer 420, the patterned photoresist layers 422 is then stripped. The patterned photoresist layers 422 may be removed by a dry etching process, a wet etching process, a plasma ashing process or another suitable process.

As exemplarily illustrated in FIG. 4E, the protrusion nanostructures 430 are pillar-shaped. In some other embodiments, some of the protrusion nanostructures 430 are pillar-shaped, and the others of the protrusion nanostructures 430 are cone-shaped. In certain other embodiments, the protrusion nanostructures 430 are cone-shaped.

Figure 4F:
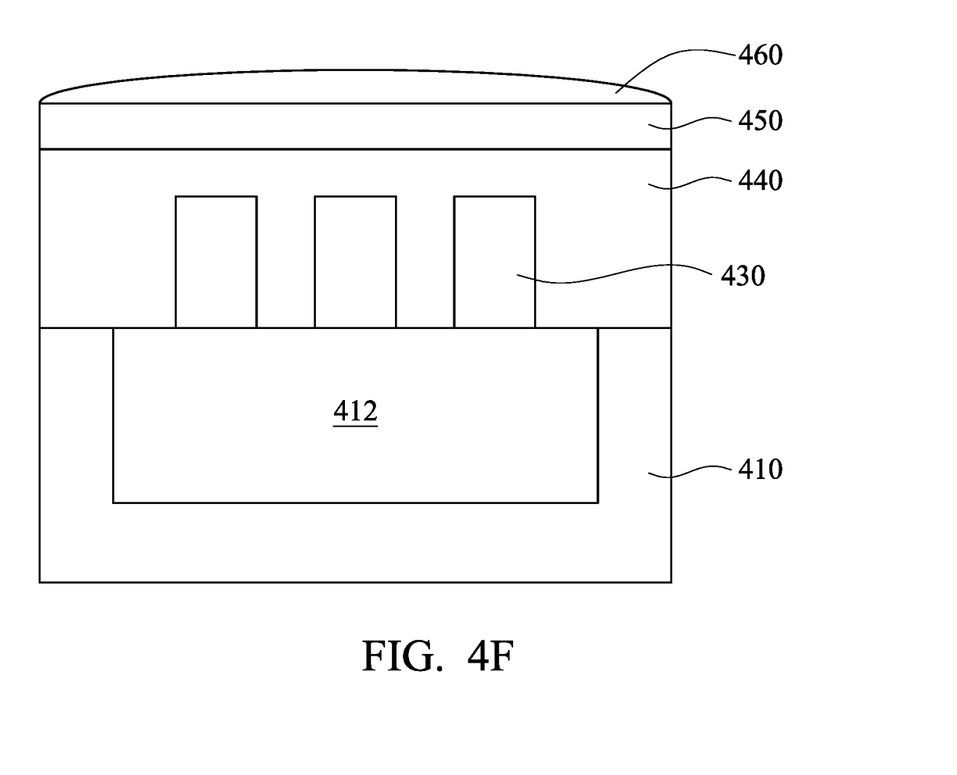

In FIG. 4F, a dielectric layer 440 is formed on the substrate 410 and covering the protrusion nanostructures 430, and a light filter layer 450 and a microlens layer are sequentially formed on the dielectric layer 440. The dielectric layer 440 may be formed from USG, hafnium oxide, silicon, silicon germanium, combinations thereof, or the like. The dielectric layer 440 may be formed by a deposition process such as a PVD process, a CVD process, an LPCVD process, a PECVD process, an HDPCVD process, an ALD process, a spin-on coating process, a sputtering process, and/or another suitable process. In alternative embodiments, the dielectric layer 440 is a vacuum layer. Moreover, in some embodiments, the dielectric layer 440 may be formed including multiple layers.

The light filter layer 450 is formed for allowing light components in a particular wavelength band to penetrate therethrough and blocking unwanted light components. The passing wavelength band of the light filter layer 450 may be a red light wavelength band, a green light wavelength band, a blue light wavelength band, an infrared light wavelength band, an ultraviolet light wavelength band, or combinations thereof, but is not limited thereto. The light filter layer 450 may be formed form a material, such as pigment-based polymer, dye-based polymer, resin and another suitable material. The light filter layer 450 may be formed by a coating process or another suitable process.

The microlens layer 460 is formed having a convex shape at its light receiving side for improving light receiving efficiency. The microlens layer 460 may be formed from glass, acrylic polymer or another suitable material with high transmittance. The microlens layer 460 may be formed by a spin-on process, a CVD process, a PVD process, and/or another suitable process.

Figure 5A:
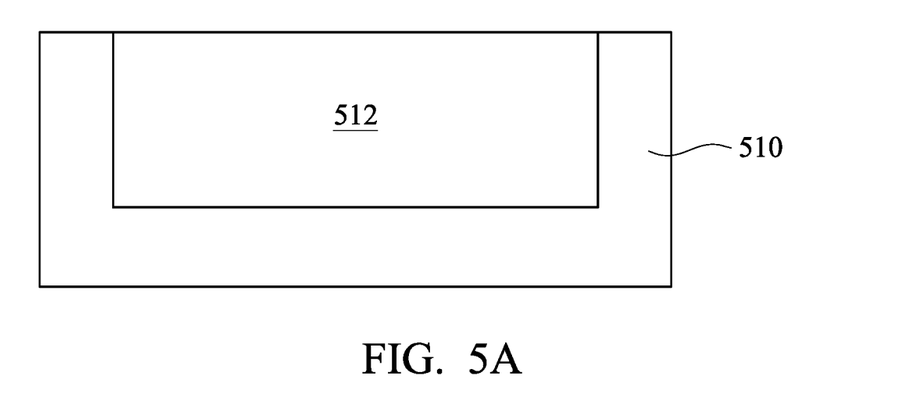
FIG. 5A to FIG. 5E are schematic cross-sectional views of intermediate stages in the formation of a semiconductor device in accordance with certain embodiments of the present disclosure.

FIG. 5A to FIG. 5E are schematic cross-sectional views of intermediate stages in the formation of a semiconductor device in accordance with some embodiments of the present disclosure. In FIG. 5A, a substrate 510 is provided, which includes a photo sensing region 512. The substrate 510 may be, for example, an SOI substrate or an epitaxial substrate. In some embodiments, the substrate 510 is formed further including an elementary semiconductor such as silicon, germanium and diamond. In various embodiments, the substrate 510 is formed further including a compound semiconductor such as silicon carbide, gallium arsenic, gallium carbide, gallium phosphide, indium arsenide, or indium phosphide, or an alloy semiconductor such as silicon germanium, silicon germanium carbide, gallium arsenic phosphide and gallium indium phosphide.

The photo sensing region 512 is formed for absorbing incident light. In some embodiments, the substrate 510 is a p-type doped substrate, and the photo sensing region 512 is a doped region with n-type dopants. In certain embodiments, the substrate 510 is an n-type doped substrate, and the photo sensing region 512 is a doped region with p-type dopants. The photo sensing region 512 may be formed by an ion implantation process, a diffusion process, or another suitable process.

Figure 5B:
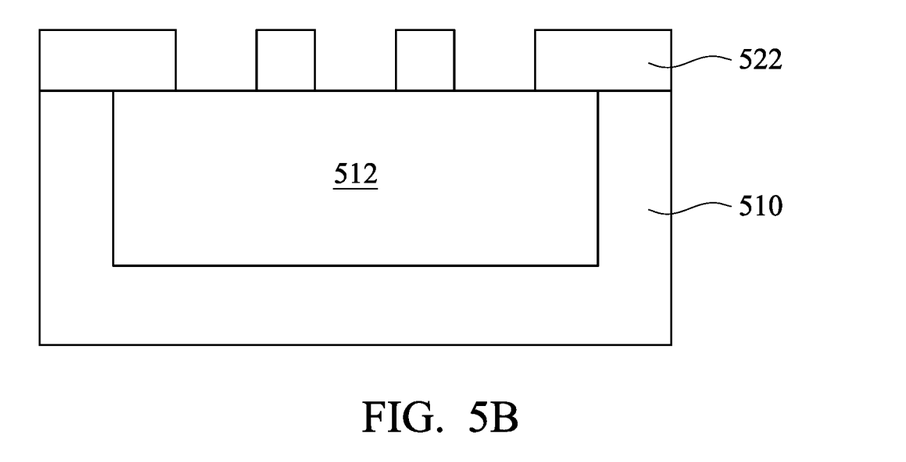

In FIG. 5B, a patterned photoresist layer 522 is formed on the substrate 510 and the photo sensing region 512. The patterned photoresist layer 522 has openings which define etching portions of the photo sensing region 512. The patterned photoresist layer 522 may be formed from a positive material and patterned by a clear tone mask. In some other embodiments, the patterned photoresist layer 522 may be formed from a negative material and patterned by a dark tone mask.

Figure 5C:
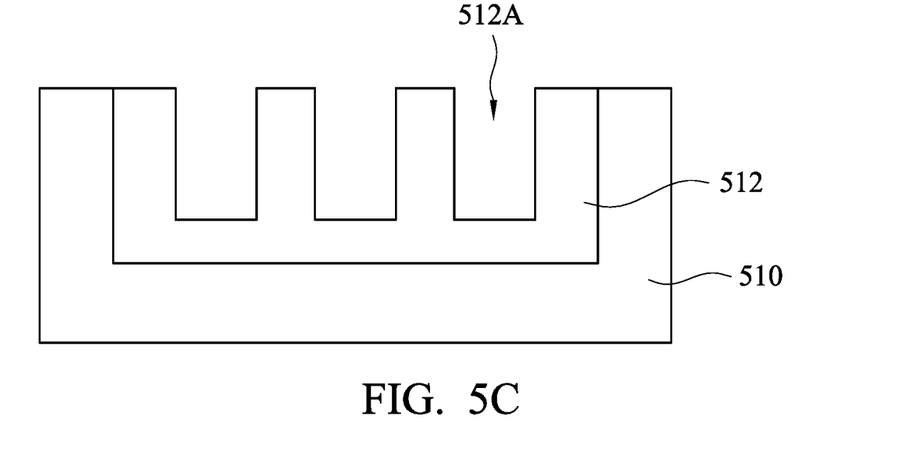

In FIG. 5C, the etching portions of the photo sensing region 512 uncovered by the patterned photoresist layer 522 are removed, so as to form recesses 512A. The etching process may be an isotropic etching process or an anisotropic etching process, such as a reactive ion etching process, a plasma etching process, a dry etching process, and wet etching process, but is not limited thereto. After the recesses 512A are formed, the patterned photoresist layer 522 is then stripped. The patterned photoresist layer 522 may be removed by a dry etching process, a wet etching process, a plasma ashing process or another suitable process.

Figure 5D:
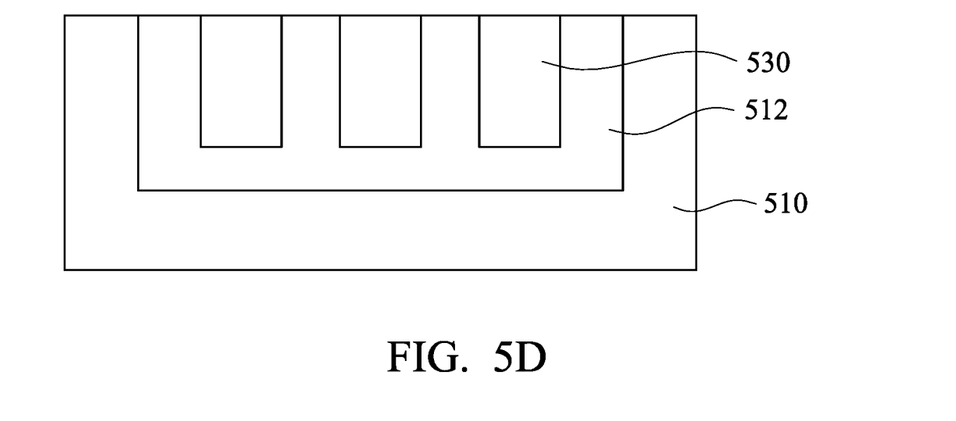

In FIG. 5D, a material is filled into the recesses 512A to form embedded nanostructures 530. The embedded nanostructures 530 may be formed from, for example, silicon oxide, hafnium oxide, silicon, silicon germanium, combinations thereof, or the like. The embedded nanostructures 530 may be formed by a deposition process such as a PVD process, a CVD process, an LPCVD process, a PECVD process, an HDPCVD process, an ALD process, a spin-on coating process, a sputtering process, and/or another suitable process. In some embodiments, an extra planarization process may be performed to planarize the upper surfaces of the embedded nanostructures 530.

As exemplarily illustrated in FIG. 5D, the embedded nanostructures 530 are pillar-shaped. In some other embodiments, some of the embedded nanostructures 530 are pillar-shaped, and the others of the embedded nanostructures 530 are cone-shaped or reverse cone-shaped. In certain other embodiments, the embedded nanostructures 530 are cone-shaped or reverse cone-shaped.

In particular, each of the embedded nanostructures 530 is formed having a projected portion on the upper surface of the substrate 510. A circle equivalent diameter of the projected portion is between 100 nm and 1900 nm. The circle equivalent diameter of the projected portion may be between 400 nm and 700 nm for enhancing visible light absorption, or may be between 700 nm and 1900 nm for enhancing infrared light absorption, or may be between 100 nm and 400 nm for enhancing ultraviolet light absorption. In addition, the embedded nanostructures 530 may be formed having the same or different circle equivalent diameters and/or heights.

Moreover, the embedded nanostructures 530 may be formed having one or more of the arrangements, the top-view shapes and the side-view shapes respectively illustrated in FIG. 3A to FIG. 3C, or other arrangement(s), top-view shape(s) and/or side-view shape(s).

In some other embodiments, the top of the embedded nanostructures 530 may be higher than the upper surface of the substrate 510. In such case, extra processes (including a photoresist patterning process and an etching process) may be performed to form the embedded nanostructures 530 which higher tops than the upper surface of the substrate 510. The extra processes are similar to those illustrated in FIG. 4C to FIG. 4E, and thus detailed descriptions thereof are not repeated herein.

Figure 5E:
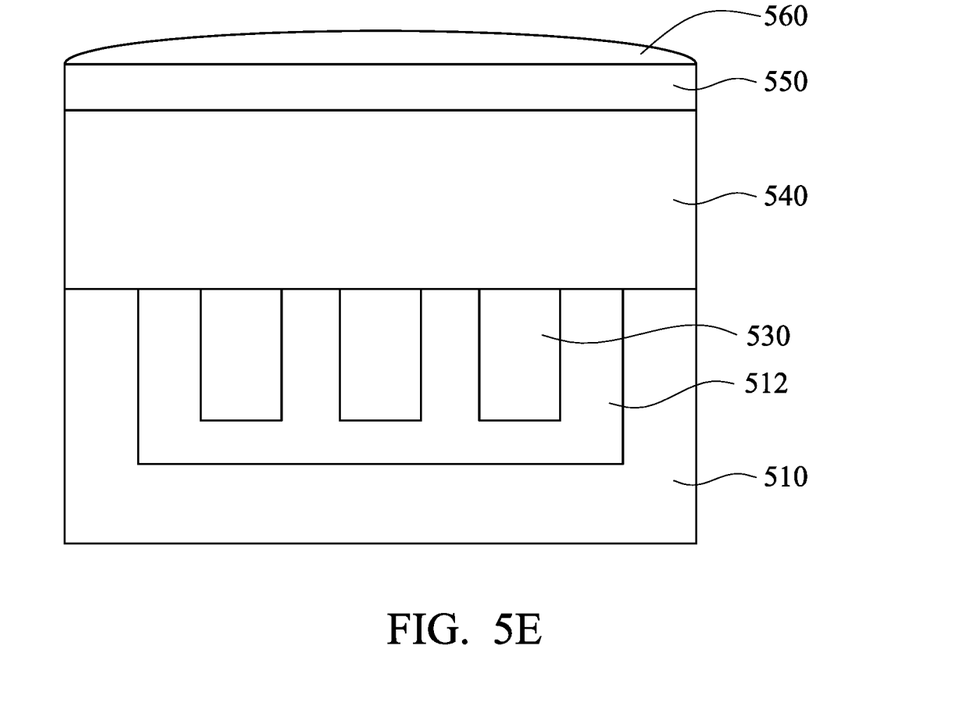

In FIG. 5E, a dielectric layer 540, a light filter layer 550 and a microlens layer are sequentially formed on the substrate 510 and the embedded nanostructures 530. The dielectric layer 540 may be formed from USG, hafnium oxide, silicon, silicon germanium, combinations thereof, or the like. The dielectric layer 540 may be formed by a deposition process such as a PVD process, a CVD process, an LPCVD process, a PECVD process, an HDPCVD process, an ALD process, a spin-on coating process, a sputtering process, and/or another suitable process. In alternative embodiments, the dielectric layer 540 is a vacuum layer. Moreover, in some embodiments, the dielectric layer 540 may be formed including multiple layers.

The light filter layer 550 is formed for allowing light components in a particular wavelength band to penetrate therethrough and blocking unwanted light components. The passing wavelength band of the light filter layer 550 may be a red light wavelength band, a green light wavelength band, a blue light wavelength band, an infrared light wavelength band, an ultraviolet light wavelength band, or combinations thereof, but is not limited thereto. The light filter layer 550 may be formed form a material, such as pigment-based polymer, dye-based polymer, resin and another suitable material. The light filter layer 550 may be formed by a coating process or another suitable process.

The microlens layer 560 is formed having a convex shape at its light receiving side for improving light receiving efficiency. The microlens layer 560 may be formed from glass, acrylic polymer or another suitable material with high transmittance. The microlens layer 560 may be formed by a spin-on process, a CVD process, a PVD process, and/or another suitable process.

In accordance with some embodiments, a method of forming a semiconductor device includes forming a photo sensing region in a semiconductor substrate, wherein the semiconductor substrate is of a first type dopant and the photo sensing region is of a second type dopant that has a different conductivity type than the first type dopant; forming a nanostructure layer in contact with an interface between the photo sensing region and the semiconductor substrate; and etching the nanostructure layer until exposing the photo sensing region to form a plurality of nanostructures.

In accordance with some embodiments, a method of forming a semiconductor device includes forming a photo sensing region in a semiconductor substrate, wherein the semiconductor substrate is of a first type dopant and the photo sensing region is of a second type dopant that has a different conductivity type than the first type dopant; removing portions of the photo sensing region to form a plurality of recesses; filling a material into the recesses; and planarizing the material until exposing the photo sensing region to form a plurality of nanostructures.

In accordance with some embodiments, a method of forming a semiconductor device includes forming a photo sensing region in a semiconductor substrate, wherein the semiconductor substrate is of a p-type dopant and the photo sensing region is of a n-type dopant; forming a nanostructure layer above the photo sensing region; etching the nanostructure layer to form a plurality of nanostructures; and forming a light filter layer over the nanostructures.

In some embodiments, a semiconductor device includes a semiconductor substrate, a photo sensing region, and a plurality of nano structures. The semiconductor substrate has a first dopant. The photo sensing region is embedded in the semiconductor substrate, has a top surface level with a top surface of the semiconductor substrate, and has a second dopant that is of a different conductivity type than the first dopant. The plurality of nanostructures is on the photo sensing region and is made of a material the same as the photo sensing region. In some embodiments, the nanostructures each have a diameter in a range from 400 nm to 700 nm. In some embodiments, the plurality of nanostructures each have a diameter in a range from 700 nm to 1900 nm. In some embodiments, the plurality of nanostructures each have a diameter in a range from 100 nm to 400 nm. In some embodiments, the nanostructures are made of silicon. In some embodiments, the nanostructures are made of silicon germanium. In some embodiments, the semiconductor device further includes a dielectric layer over the nanostructures and extending laterally across an interface between the semiconductor substrate and the photo sensing region. In some embodiments, the semiconductor device further includes a light filter layer over and spaced apart from the nanostructures. In some embodiments, the semiconductor device further includes a light filter layer over the nanostructures, wherein the light filter layer has a wider width than the photo sensing region. In some embodiments, the first dopant of the semiconductor substrate is an n-type dopant and the second dopant of the photo sensing region is a p-type dopant.

In some embodiments, a semiconductor device includes a photo sensing region, a semiconductor substrate, and a plurality of nanostructures. The photo sensing region has a first dopant. The semiconductor substrate laterally surrounds the photo sensing region and has a second dopant that is of a different conductivity type than the first dopant. The plurality of nanostructures are embedded in the photo sensing region and have top surfaces level with a top surface of the photo sensing region. In some embodiments, the top surfaces of the plurality of nanostructures are also level with a top surface of the semiconductor substrate. In some embodiments, the plurality of nanostructures each have a bottom surface higher than a bottommost position of the photo sensing region. In some embodiments, the plurality of nanostructures are spaced apart from each other by the photo sensing region. In some embodiments, the plurality of nanostructures each have a triangular cross section. In some embodiments, the semiconductor device further includes a dielectric layer over the plurality of nanostructures and laterally extending across an interface between the semiconductor substrate and the photo sensing region.

In some embodiments, a method of forming a semiconductor device includes forming a photo sensing region in a semiconductor substrate; forming a nanostructure layer extending across opposite sidewalls the photo sensing region; etching the nanostructure layer until the photo sensing region is exposed to form a plurality of nanostructures on the photo sensing region; forming a dielectric layer over the nanostructures; and forming a light filter layer over the dielectric layer. In some embodiments, forming the nanostructure layer is such that the nanostructure layer is in contact with an interface between the semiconductor substrate and the photo sensing region. In some embodiments, forming the light filter is such that the light filter layer extends across the opposite sidewalls of the photo sensing region. In some embodiments, the method further includes forming a microlens layer over the light filter, wherein the microlens layer has a wider width than the photo sensing region.

In some embodiments, a device includes a substrate, a photo sensing region, and a plurality of semiconductor plugs. The photo sensing region is in the substrate. The photo sensing region forms a p-n junction with the substrate. The semiconductor plugs extend from above the photo sensing region into the photo sensing region.

In some embodiments, a device includes a substrate, a photo sensing region, and a plurality of nanostructures. The substrate has a first dopant. The photo sensing region is in the substrate. The photo sensing region has a second dopant of a conductivity type opposite a conductivity type of the first dopant. The nanostructures protrude from a plurality of recessed regions in the photo sensing region to a position higher than a top surface of the photo sensing region.

In some embodiments, a device includes a substrate, a photo sensing region, and a plurality of pillars. The photo sensing region forms an U-shaped interface with the substrate. The pillars are partially embedded in the photo sensing region. The pillars have top ends higher than a top surface of the photo sensing region, and bottom ends higher than a bottom surface of the photo sensing region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
   a substrate;
   a light absorption region over the substrate; and
   a nanostructure array over the light absorption region, the nanostructure array comprising a plurality of nanostructures repeatedly arranged from a top view, wherein the plurality of nanostructures are at least partially embedded within the light absorption region.

2. The image sensor device of claim 1, wherein the plurality of nanostructures are formed of a semiconductor.

3. The image sensor device of claim 1, wherein the plurality of nanostructures are arranged in a hexagonal arrangement, an octagonal arrangement, or a triangular arrangement.

4. The image sensor device of claim 1, further comprising:
   a color filter layer over the nanostructure array.

5. The image sensor device of claim 4, further comprising:
   a microlens layer over the color filter layer.

6. The image sensor device of claim 1, further comprising:
   a dielectric layer over the plurality of nanostructures and extending laterally across an interface between the substrate and the light absorption region.

7. The image sensor device of claim 1, wherein one of the plurality of nanostructures has a sidewall in contact with the light absorption region.

8. The image sensor device of claim 1, wherein the light absorption region has a conductivity type different from a conductivity type of the substrate.

9. The image sensor device of claim 1, wherein one of plurality of nanostructures has a top surface level with a top surface of the light absorption region.

10. The image sensor device of claim 1, wherein one of plurality of nanostructures has a top surface at a different elevation than a top surface of the light absorption region.

11. The image sensor device of claim 1, wherein one of the plurality of nanostructures is entirely embedded within the light absorption region.

12. An image sensor device, comprising;
    a semiconductor substrate;
    a photo sensing region in the semiconductor substrate; and
    a nanostructure array over the photo sensing region, wherein the nanostructure array comprises a plurality of nanostructures disposed over the photo sensing region from a cross-sectional view, and the plurality of nanostructures have polygonal patterns from a top view, wherein the plurality of nanostructures are at least partially embedded within the photo sensing region.

13. The image sensor device of claim 12, wherein one or more of the plurality of nanostructures have polygonal patterns from the cross-sectional view.

14. The image sensor device of claim 12, wherein one or more of the plurality of nanostructures have quadrilateral patterns from the cross-sectional view.

15. The image sensor device of claim 12, wherein the plurality of nanostructures are in contact with the photo sensing region from the cross-sectional view.

16. The image sensor device of claim 12, wherein one of the polygonal patterns of the plurality of nanostructures is a triangular pattern.

17. The image sensor device of claim 12, wherein one of the plurality of nanostructures has a top surface higher than a top surface of the photo sensing region, and a bottom surface lower than the top surface of the photo sensing region.

18. An image sensor device, comprising:
  a semiconductor substrate;
  a photo sensing region in the semiconductor substrate; and
  a nanostructure array over the photo sensing region, wherein the nanostructure array comprises a plurality of nanostructures above the photo sensing region from a cross-sectional view, and the plurality of nanostructures are periodically arranged from a top view, wherein the plurality of nanostructures are arranged in a hexagonal arrangement, an octagonal arrangement, or a triangular arrangement.

19. The image sensor device of claim 18, wherein the plurality of nanostructures are in contact with the photo sensing region from the cross-sectional view.

20. The image sensor device of claim 18, wherein the plurality of nanostructures are made of a different material than the photo sensing region.

* * * * *